United States Patent
Salmon (10) Patent No.: US 12,255,122 B1
(45) Date of Patent: Mar. 18, 2025

(54) WATER-COOLED ELECTRONIC SYSTEM

(71) Applicant: Peter C. Salmon, Mountain View, CA (US)

(72) Inventor: Peter C. Salmon, Mountain View, CA (US)

( * ) Notice: Subject to any disclaimer, the term of this patent is extended or adjusted under 35 U.S.C. 154(b) by 0 days.

(21) Appl. No.: 18/538,824

(22) Filed: Dec. 13, 2023

(51) Int. Cl.
*H05K 7/20* (2006.01)
*H01L 23/473* (2006.01)

(52) U.S. Cl.
CPC ....... *H01L 23/473* (2013.01); *H05K 7/20772* (2013.01); *H05K 7/20809* (2013.01)

(58) Field of Classification Search
None
See application file for complete search history.

(56) References Cited

U.S. PATENT DOCUMENTS

| | | |
|---|---|---|
| 4,114,275 A | 9/1978 | Jones et al. |
| 4,124,338 A | 11/1978 | Mitchell |
| 4,169,262 A | 9/1979 | Schwartz et al. |
| 4,259,676 A | 3/1981 | Salmon |
| 4,309,365 A | 1/1982 | Van Ness et al. |
| 4,341,518 A | 7/1982 | Wallace |
| 4,366,802 A | 1/1983 | Goodine et al. |
| 4,419,300 A | 12/1983 | Van Ness et al. |
| 4,534,803 A | 8/1985 | Asano et al. |
| 4,551,787 A | 11/1985 | Mittal et al. |
| 4,585,293 A | 4/1986 | Czeschka et al. |
| 4,669,529 A | 6/1987 | Evertz |
| 4,677,528 A | 6/1987 | Miniet |
| 4,733,256 A | 3/1988 | Salmon |
| 4,765,400 A | 8/1988 | Chu et al. |
| 4,777,500 A | 10/1988 | Salmon |
| RE32,897 E | 3/1989 | Salmon |
| 4,928,207 A | 5/1990 | Chrysler et al. |
| 4,973,247 A | 11/1990 | Varnes et al. |
| 4,975,058 A | 12/1990 | Woodward |
| 4,978,548 A | 12/1990 | Cope et al. |
| 4,993,229 A | 2/1991 | Baus et al. |
| 5,028,988 A | 7/1991 | Porter et al. |
| 5,030,976 A | 7/1991 | Salmon |
| 5,074,787 A | 12/1991 | Tsukada |

(Continued)

OTHER PUBLICATIONS

Birbarah et al., Water Immersion Cooling of High Power Density Electronics, International Journal of Heat and Mass Transfer, 2020, vol. 147, 13 pages.

(Continued)

*Primary Examiner* — Courtney L Smith
(74) *Attorney, Agent, or Firm* — Jennifer Hayes; Nixon Peabody LLP (57) ABSTRACT

A water-cooled electronic system includes a tank filled with an array of microelectronic modules spaced apart in the tank, creating water channels between the modules. A water conduit connects between the tank output and the tank input and includes a variable pump. The modules are cooled by water flowing in the channels, and a system controller implements a master control algorithm to maintain an optimal balance between single-phase and two-phase cooling, by controlling the output pressure of the variable pump in addition to monitoring and controlling local temperatures and pressures and throttling input power when necessary to meet pre-determined safety conditions.

29 Claims, 9 Drawing Sheets

(56) References Cited

U.S. PATENT DOCUMENTS

| | | | |
|---|---|---|---|
| 5,088,924 A | 2/1992 | Woodward |
| 5,145,370 A | 9/1992 | Woodward |
| 5,153,617 A | 10/1992 | Salmon |
| 5,155,661 A | 10/1992 | Nagesh et al. |
| 5,214,570 A | 5/1993 | Shah et al. |
| 5,283,446 A | 2/1994 | Tanisawa |
| 5,287,127 A | 2/1994 | Salmon |
| 5,323,292 A | 6/1994 | Brzezinski |
| 5,400,062 A | 3/1995 | Salmon |
| 5,465,192 A | 11/1995 | Yoshikawa |
| 5,476,572 A | 12/1995 | Prough |
| 5,478,778 A | 12/1995 | Tanisawa |
| 5,501,077 A | 3/1996 | Davis et al. |
| 5,514,906 A | 5/1996 | Love et al. |
| 5,555,579 A | 9/1996 | Wu et al. |
| 5,700,355 A | 12/1997 | Prough |
| 5,717,608 A | 2/1998 | Jensen |
| 5,778,677 A | 7/1998 | Hung et al. |
| 5,800,170 A | 9/1998 | Tsukada |
| 5,859,763 A | 1/1999 | Nam et al. |
| 5,897,610 A | 4/1999 | Jensen |
| 5,968,314 A | 10/1999 | Prough |
| 6,055,157 A | 4/2000 | Bartilson |
| 6,126,099 A | 10/2000 | Fachinger et al. |
| 6,126,883 A | 10/2000 | Troetscher et al. |
| 6,309,049 B1 | 1/2001 | Salmon |
| 6,210,262 B1 | 4/2001 | Burch et al. |
| 6,251,466 B1 | 6/2001 | McGuire et al. |
| 6,404,640 B1 | 6/2002 | Ishimine et al. |
| 6,452,789 B1 | 9/2002 | Pallotti et al. |
| 6,467,679 B2 | 10/2002 | Kyomasu et al. |
| 6,491,202 B1 | 12/2002 | Kyomasu et al. |
| 6,528,878 B1 | 3/2003 | Daikoku et al. |
| 6,601,295 B2 | 8/2003 | Maekawa |
| 6,621,707 B2 | 9/2003 | Ishimine et al. |
| 6,644,058 B2 | 11/2003 | Bash et al. |
| 6,664,627 B2 | 12/2003 | Cheon |
| 6,817,204 B2 | 11/2004 | Bash et al. |
| 6,853,554 B2 | 2/2005 | Bash et al. |
| 6,881,609 B2 | 4/2005 | Salmon |
| 6,882,533 B2 | 4/2005 | Bash et al. |
| 6,890,799 B2 | 5/2005 | Daikoku et al. |
| 6,927,471 B2 | 8/2005 | Salmon |
| 7,069,737 B2 | 7/2006 | Wang et al. |
| 7,144,792 B2 | 12/2006 | Wilmot et al. |
| 7,163,830 B2 | 1/2007 | Salmon |
| 7,240,500 B2 | 7/2007 | Bash et al. |
| 7,254,024 B2 | 8/2007 | Salmon |
| 7,297,572 B2 | 11/2007 | Salmon |
| 7,408,258 B2 | 8/2008 | Salmon |
| 7,415,289 B2 | 8/2008 | Salmon |
| 7,427,809 B2 | 9/2008 | Salmon |
| 7,455,094 B2 | 11/2008 | Lee et al. |
| 7,505,862 B2 | 3/2009 | Salmon |
| 7,535,107 B2 | 5/2009 | Salmon |
| 7,586,747 B2 | 9/2009 | Salmon |
| 7,658,614 B2 | 2/2010 | Wilmot et al. |
| 7,659,141 B2 | 2/2010 | Chung-Long-Shan et al. |
| 7,738,250 B2 | 6/2010 | Wu et al. |
| 7,902,666 B1 | 3/2011 | Hsu et al. |
| 7,946,465 B2 | 5/2011 | Silverbrook et al. |
| 7,952,191 B2 | 5/2011 | Sunohara et al. |
| 7,988,033 B2 | 8/2011 | Chung-Long-Shan et al. |
| 8,252,635 B2 | 8/2012 | Salmon |
| 8,369,091 B2 | 2/2013 | Campbell |
| 8,457,806 B2 | 6/2013 | Shah |
| 8,685,833 B2 | 4/2014 | Khanna et al. |
| 8,780,552 B2 | 7/2014 | El-Essawy |
| 8,787,015 B2 * | 7/2014 | El-Essawy ............... G06F 1/20 |
| | | 165/104.34 |
| 8,842,688 B2 | 9/2014 | Vahdat |
| 8,922,511 B1 | 12/2014 | Salmon |
| 9,059,070 B2 | 6/2015 | Salmon |
| 9,061,893 B1 | 6/2015 | Minervini |
| 9,095,942 B2 | 8/2015 | Campbell |
| 9,142,533 B2 | 9/2015 | Shen et al. |
| 9,214,416 B1 | 12/2015 | Furnival |
| 9,227,220 B1 | 1/2016 | Salmon |
| 9,250,024 B2 | 2/2016 | Campbell |
| 9,257,751 B2 | 2/2016 | Felic et al. |
| 9,386,685 B2 | 7/2016 | Bonkohara |
| 9,493,102 B2 | 11/2016 | Tang et al. |
| 9,576,409 B2 | 2/2017 | Salmon |
| 9,633,771 B2 | 4/2017 | Salmon |
| 9,761,620 B1 | 9/2017 | Salmon |
| 9,773,755 B2 | 9/2017 | Shen et al. |
| 9,874,923 B1 | 1/2018 | Brown |
| 10,039,210 B2 | 7/2018 | Wong |
| 10,249,503 B2 | 4/2019 | Yoon et al. |
| 10,336,599 B2 | 7/2019 | Miles |
| 10,461,009 B2 | 10/2019 | Hung et al. |
| 10,481,650 B2 | 11/2019 | Saito |
| 10,613,603 B2 * | 4/2020 | Bose ................. G06F 1/3206 |
| 10,624,236 B2 | 4/2020 | Inano |
| 10,701,832 B2 | 6/2020 | Chainer et al. |
| 10,757,833 B2 * | 8/2020 | Bodenweber ...... H05K 7/20254 |
| 10,910,364 B2 | 2/2021 | Or-Bach |
| 10,966,338 B1 | 3/2021 | Salmon |
| 11,064,626 B1 | 7/2021 | Salmon |
| 11,138,103 B1 | 10/2021 | Shi |
| 11,256,320 B2 | 2/2022 | McNamara |
| 11,379,254 B1 | 7/2022 | Karumbunathan |
| 11,393,807 B2 | 7/2022 | Salmon |
| 11,445,640 B1 | 9/2022 | Salmon |
| 11,523,543 B1 | 12/2022 | Salmon |
| 11,546,991 B2 | 1/2023 | Salmon |
| 11,692,271 B2 | 7/2023 | Miljkovic et al. |
| 11,856,727 B2 | 12/2023 | Monteserin |
| 2001/0042777 A1 | 11/2001 | Kyomasu et al. |
| 2003/0000552 A1 | 9/2003 | Bratten et al. |
| 2003/0151130 A1 | 12/2003 | Cheon |
| 2005/0126766 A1 | 6/2005 | Lee |
| 2005/0240812 A1 | 10/2005 | Anderson |
| 2005/0254214 A1 | 11/2005 | Salmon |
| 2006/0244926 A1 | 4/2006 | Shih et al. |
| 2007/0007983 A1 | 1/2007 | Salmon |
| 2007/0074853 A1 * | 4/2007 | Popovich ........... H05K 7/20245 |
| | | 165/80.4 |
| 2007/0176298 A1 | 8/2007 | Osone |
| 2007/0240785 A1 | 10/2007 | Lee |
| 2007/0256773 A1 | 11/2007 | Huang |
| 2009/0185343 A1 | 7/2009 | Wu |
| 2010/0275971 A1 | 11/2010 | Zingher |
| 2011/0192172 A1 | 8/2011 | Delacruz |
| 2011/0302346 A1 | 12/2011 | Vahdat |
| 2012/0165908 A1 | 6/2012 | Kou et al. |
| 2012/0217772 A1 | 8/2012 | Tang |
| 2013/0015578 A1 | 1/2013 | Thacker |
| 2013/0228898 A1 | 9/2013 | Ide |
| 2014/0123492 A1 | 5/2014 | Campbell |
| 2014/0137581 A1 * | 5/2014 | Cho ................. F28D 15/0266 |
| | | 62/119 |
| 2015/0199858 A1 | 7/2015 | Salmon |
| 2016/0088756 A1 | 3/2016 | Ramadas |
| 2016/0155682 A1 | 6/2016 | Ahuja et al. |
| 2017/0015477 A1 | 1/2017 | Miles |
| 2017/0254574 A1 | 1/2017 | Miles |
| 2017/0292782 A1 | 10/2017 | Joyer et al. |
| 2017/0308133 A1 | 10/2017 | Soffer |
| 2017/0354061 A1 | 12/2017 | Saito |
| 2018/0170744 A1 | 6/2018 | Petersen et al. |
| 2018/0293017 A1 | 10/2018 | Curley |
| 2018/0315730 A1 | 11/2018 | Gill et al. |
| 2018/0320937 A1 | 11/2018 | Deng et al. |
| 2019/0041104 A1 | 2/2019 | Yin |
| 2019/0041105 A1 | 2/2019 | Yin |
| 2019/0286373 A1 | 9/2019 | Karumbunathan et al. |
| 2019/0363196 A1 | 11/2019 | Wood |
| 2019/0377391 A1 | 12/2019 | Chen |
| 2020/0022601 A1 | 1/2020 | Rogers |
| 2020/0027809 A1 | 1/2020 | Hung et al. |
| 2020/0029465 A1 * | 1/2020 | Chainer ............ H05K 7/20818 |
| 2020/0089293 A1 | 3/2020 | Enright |
| 2020/0091111 A1 | 3/2020 | Lee et al. |

(56) References Cited

U.S. PATENT DOCUMENTS

| | | | |
|---|---|---|---|
| 2020/0093038 A1* | 3/2020 | Enright | H05K 7/20318 |
| 2020/0243429 A1 | 7/2020 | Lai et al. | |
| 2020/0310394 A1 | 10/2020 | Wouhaybi | |
| 2020/0328139 A1 | 10/2020 | Chiu | |
| 2021/0343690 A1 | 11/2021 | Salmon | |
| 2022/0087048 A1 | 3/2022 | Enright | |
| 2022/0113784 A1 | 4/2022 | Alben et al. | |
| 2022/0217845 A1 | 7/2022 | Salmon | |
| 2023/0088049 A1 | 3/2023 | Salmon | |
| 2023/0180439 A9* | 6/2023 | Enright | H05K 7/20818 |
| | | | 361/700 |
| 2023/0276600 A1 | 8/2023 | Salmon | |
| 2023/0380101 A1* | 11/2023 | Sullivan | H05K 7/20236 |
| 2023/0413466 A1* | 12/2023 | Heydari | H05K 7/20836 |

OTHER PUBLICATIONS

Gebrael et al., High-Efficiency Cooling via the Monolithic Integration of Copper on Electronic Devices, Nature Electronics, 2022, vol. 5, pp. 394-402.

\* cited by examiner

WATER-COOLED ELECTRONIC SYSTEM

TECHNICAL FIELD

This invention relates to water-cooled electronic systems employing both single-phase and two-phase cooling, in which the balance between single phase and two-phase cooling is optimized.

BACKGROUND

Water-cooled systems have employed micro-channels embedded in cooling plates. See U.S. Pat. No. 10,701,832, "Two Phase Liquid Cooled Electronics", issued to Chainer et al., Jun. 30, 2020. Cooling systems of this type are limited by complexity and cost, and the water flow rate is limited by the micro-channel structure.

SUMMARY

Various embodiments are directed to water-cooled electronic systems comprising microelectronic modules immersed in a tank, with water channels between them. A water conduit including a variable pump connects between the tank output and the tank input. A system controller controls the variable pump to maintain a calculated flow rate of water through the tank to achieve an optimal balance between single-phase and two-phase cooling. The flow rate may be adjusted to accommodate an elevated temperature or pressure at a hot spot, for example, and a combination of probes and sensors may be distributed throughout the system to monitor local environmental conditions.

In various embodiments, the microelectronic modules are coated with a hermetic coating to protect against water intrusion that would damage the electronics.

In other embodiments, a water-cooled server includes a motherboard coupled to multiple electronic modules arrayed within a tank. For each water channel a channel controller reads data from a suite of sensors and maintains an optimal balance between single-phase and two-phase cooling, adaptable to changes in cooling demand. The suite of sensors may include temperature sensors, pressure sensors, and flow-rate sensors. A programmable flow control assembly may be immersed in each water channel, to control the flow of water through the channel, responding to instructions from the channel controller. An artificial intelligence processor may be employed to learn nuanced interrelationships between water flow rate, temperature, and pressure in a cooling environment comprising both single-phase and two-phase cooling. For example, different processors and controllers can be configured to cooperate with one another and collectively implement an optimal strategy, including a master control algorithm, for controlling the flow rate to achieve maximum cooling efficiency. This is to be understood in a real environment that has thermal and structural limitations, for example, maximum operating temperatures for heat-sensitive materials, and maximum operating pressures for strength-limited structures.

Embodiments of the present disclosure are useful because they enable improved heat dissipation capabilities in high performance computing systems (HPCs); for example, in data centers, in automotive applications, or other applications or environments involving high power density. For example, it is an object of embodiments described herein to support a power density substantially greater than 1 kW/cm$^2$ at the surface of a microelectronic module.

DETAILED DESCRIPTION

An important aspect of the present disclosure concerns management of the balance between single-phase cooling and two-phase cooling in an electronic system. It is attractive to incorporate two-phase cooling because the latent heat of vaporization of water is 2,256 J/g. This is 5.4 times larger than the cooling power of single-phase cooling from 0° C. to 100° C. (4.186 J/g° C.×100° C.=418.6 J/g). However, boiling introduces a large amount of water vapor into the system; converting 1 gram of water (occupying 1 cm$^3$) to steam at the same temperature and normal atmospheric pressure increases the volume by 1,671 cm$^3$. Thus, steam formation will increase pressure in the coolant mixture of water and water vapor, and this will cause the coolant mixture to be ejected at a higher rate from the water output. Increasing the pressure at the water input by increasing the pump output pressure may be required to prevent back-flow. In water-cooled systems that involve moving the cooling water through micro-channels, it can be difficult to manage the increase in volume and pressure created by steam generation. By contrast, embodiments of the present invention do not confine the cooling water to micro-channels, but rather to macro-channels. For example, macro-channels in embodiments described herein may have a width of around 3 mm, a height of around 120 mm, and a depth of around 300 mm; they are formed between microelectronic modules when the modules are spaced apart in a tank of water. Since the volume of water in a macro-channel is orders of magnitude greater than the volume of water in a micro-channel, pressure variations arising from the onset of boiling are comparatively reduced. Less pressure variation leads to less mechanical stress and less mechanical stress leads to a more reliable system. It will be appreciated that the first few bubbles of steam will be carried away by the water flow without much problem. However, if too much water gets converted to steam without a water refill, for example, some devices in the electronic system may run dry: their temperature will rise rapidly, and they will fail. Additionally, pressure increases may subject structures of the electronic system to unacceptable stress. Achieving an optimal balance requires consideration of many factors, including local temperature, local pressure, mechanical stress, and these combinations are complicated by the potential existence of hot spots and water flow anomalies. Embodiments of the present disclosure solve this problem using artificial intelligence to learn the nuanced inter-dependence of the various factors, and to combine this information with traditional calculations to determine the optimal balance, and to deploy the optimal balance by implementing a master control algorithm. Traditional calculations may apply known physics and thermal equations to calculate the effects of first order changes such as pressure changes, or temperature changes, or changes in the average water flow rate, but they may not be effective in managing second order effects that may arise from interdependencies between these variables, and from potential anomalies in water flow. The water flow may vary with component placement, surface topography, surface roughness, turbulence, or eddy effects. In embodiments of the present disclosure, various processors cooperate with one another and with sensors that are distributed throughout the electronic system. They collectively determine local water temperatures and pressures and flow rates, and combine this information to determine an optimal balance of single-phase cooling versus two-phase cooling. The optimal balance may be defined as a maximum ratio of two-phase cooling to single phase cooling that is safe within the constructs of a water-cooled system. Safety means that no structures (such as structural walls or substrates or gaskets) or equipment (such as pumps, conduits, valves, sensors, filters etc.) are stressed beyond their limits, no materials are heated beyond their safe operating temperatures, and no electronic components are stressed beyond their thermal or electrical ratings. The master control algorithm may implement the integration of all control information and impose a deployed system configuration; furthermore, it may throttle input power to the system if pre-determined safety conditions cannot be met.

Figure 1:
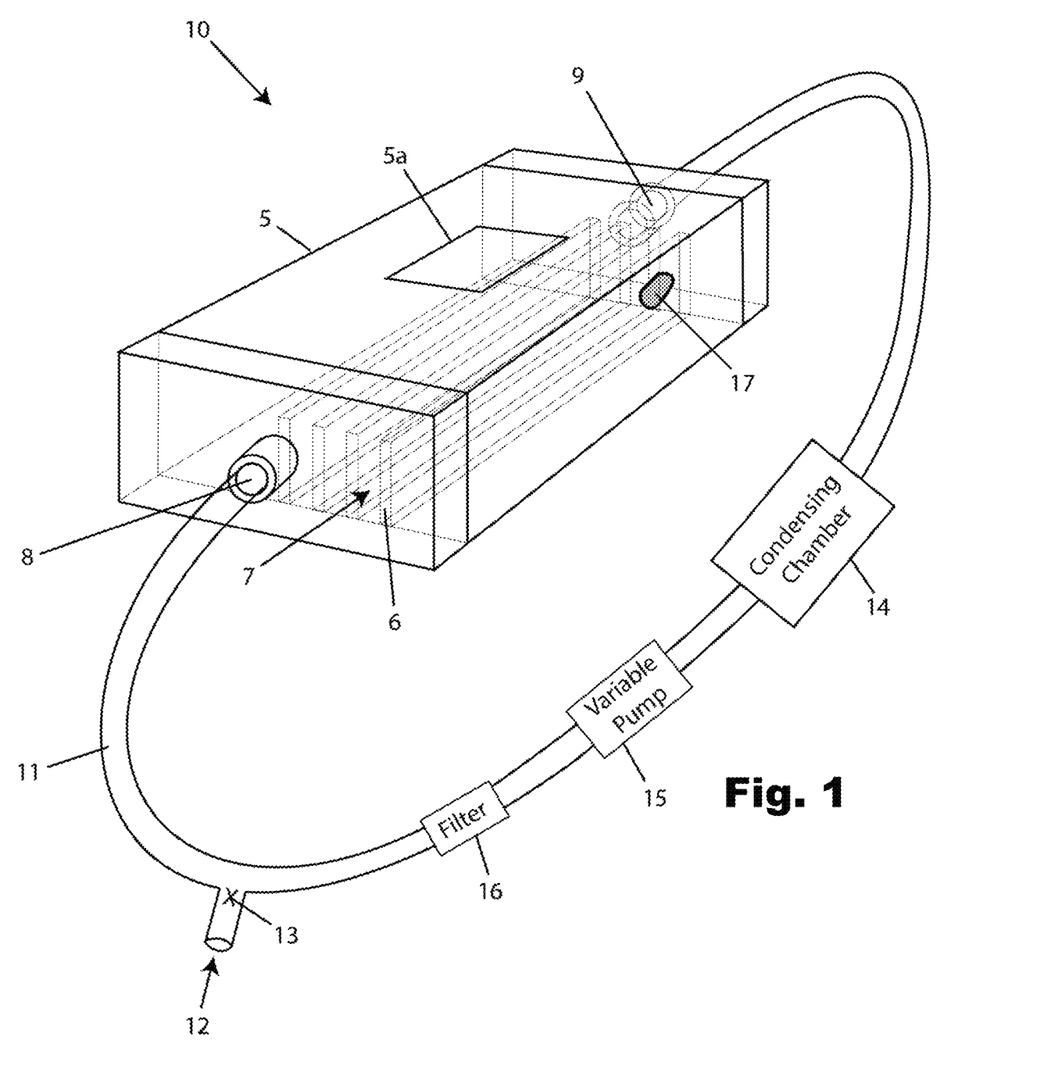
FIG. 1 illustrates a schematic view 10 of a water-cooled system, according to embodiments of the present disclosure.

FIG. 1 schematically illustrates a water-cooled electronic system 10 embodying elements of the present disclosure. Tank 5 is shown with an array of microelectronic modules 6 disposed in a spaced-apart manner within the tank, creating water channels 7 between the modules. In some embodiments, the water channels 7 are macro-channels, as discussed above. Four microelectronic modules 6 are shown in the figure; however, it will be appreciated that the system 10 may include more than four microelectronic modules 6. For example, in embodiments consistent with systems described herein, there may be for example 90 modules 6 arrayed across an 18-inch server width.

Tank 5 may be constructed from stainless steel for example, with a non-metallic port 5a in an upper region to accommodate wireless communications between controllers within the tank and external devices.

Microelectronic modules 6 are formed on planar substrates, with low-profile devices mounted thereon, and are essentially planar in form.

A water input to the tank, 8, and a water output from the tank, 9, are shown. A water conduit 11 connects from the water output 9 to the water input 8 and includes a water refill port 12 having a control valve 13 as shown.

Condensing chamber 14 is provided to convert a mixture of liquid water and water vapor to liquid water only. If the hot effluent from water output 9 cannot be used for useful heating purposes, it can be cooled using convective air cooling for example, to reduce the mixture to liquid water only.

Variable pump 15 is shown in line with water conduit 11; as will be further discussed the pump's output pressure will be controlled by a controller within tank 5; the communication link to perform this control may be wireless.

Filter 16 is shown for removing debris or residues that could accumulate over time in the water coolant. The water coolant may be tap water rather than more expensive distilled water. However, any liquid coolant may be used, including dielectric fluids and mixtures of water and ethylene glycol.

Figure 2:
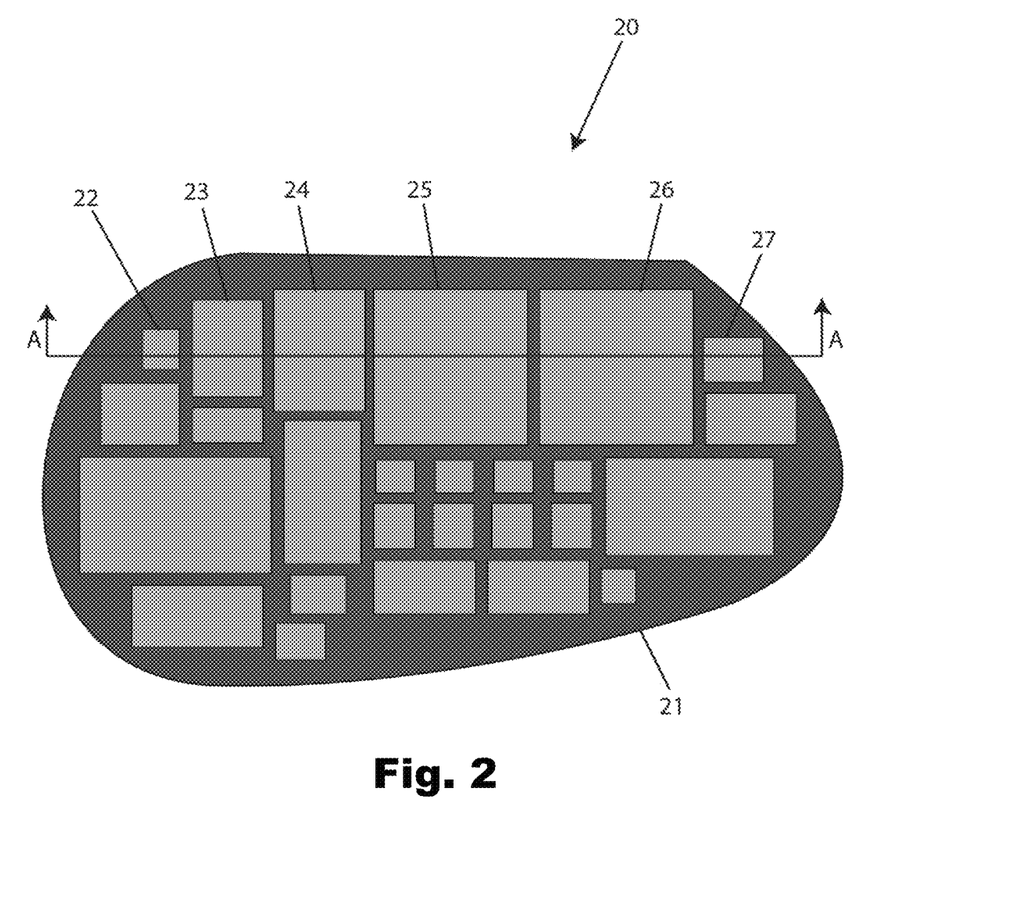
FIG. 2 illustrates a plan view 20 of a portion of a microelectronic module, according to embodiments of the present disclosure.

A patch 17 is shown, representing an example of mounted components, to be further discussed in reference to FIG. 2.

FIG. 2 shows chips and low-profile devices mounted on a substrate 21, corresponding to patch 17 of FIG. 1, in accordance with embodiments of the present disclosure. Substrate 21 may comprise an organic substrate including layers of patterned copper traces separated by layers of glass-filled epoxy for example. Substrate 21 may also comprise a ceramic material, including glass or silicon nitride, or a polymeric material, and may include redistribution layers (RDLs) fabricated thereon.

A sampling of chips that may be mounted on substrate 21 includes a thermal test chip 22, a low profile packaged device 23, a chiplet 24, a device having back side power delivery 25, a stacked device 26, or a surface mount device 27. Other package types may be used. Functions represented in the mounted components may include processors, memories, sensors, passive devices, power converters, voltage regulators, current regulators, micro-electro-mechanical systems (MEMS), thermal test chips, optical devices and optoelectronic devices as non-limiting examples. Devices may be mounted using flip chip assembly techniques for example. Section AA is expanded in a cross-sectional view in FIG. 3.

Figure 3:
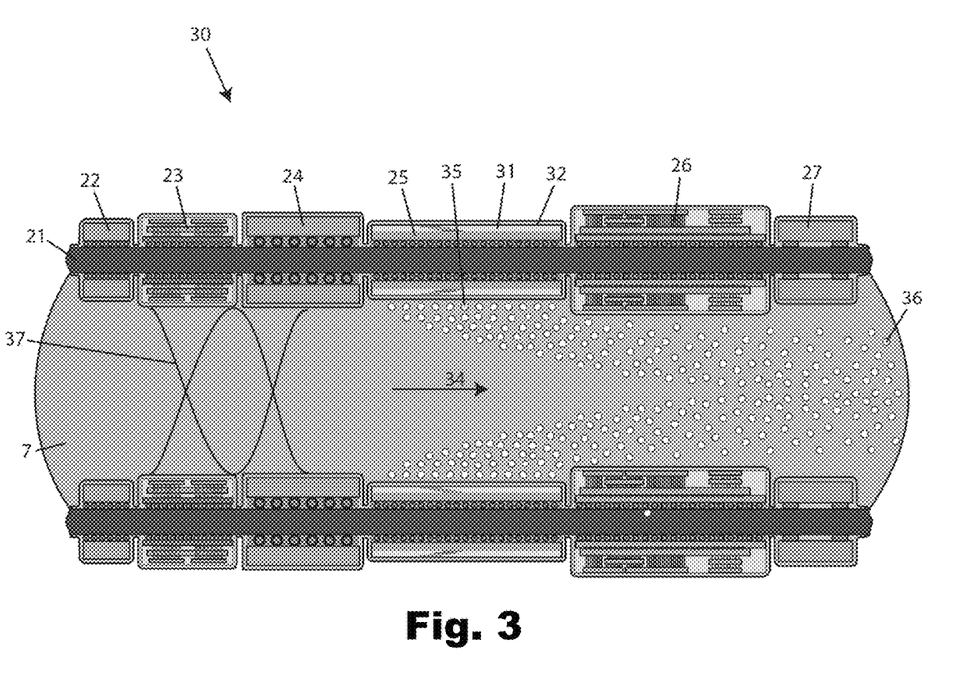
FIG. 3 illustrates a cross-sectional view 30 of a pair of microelectronic modules with a water channel created between them, including bubbles formed from two-phase cooling, according to embodiments of the present disclosure.

FIG. 3 is a cross-sectional view 30 of a water channel 7 with flowing water 34 that cools microelectronic modules on each side of the channel, in embodiments of the present disclosure. Substrate 21 is shown with thermal test chip 22, low profile packaged device 23, chiplet 24, device 25 having backside power delivery 31, stacked device 26, and surface mount device 27. Components mounted on the bottom side of substrate 21 mirror components mounted on the top side in the figure; this configuration reduces thermal stresses arising from thermal expansion mismatches that could warp the assembly.

Bubbles 35 of water vapor are shown forming next to the device having back side power distribution, 25, which is dissipating more power than neighboring devices in this example. Bubbles 35 are carried by the water flow towards the water output of the tank, as shown by bubble 36. The formation of bubbles is accompanied by increased pressure in water channel 7; a channel controller commands variable pump 15 to increase its output pressure to compensate, thereby maintaining a water flow in the channel. The desired optimal balance is achieved when the ratio of two-phase cooling to single phase cooling is maximized (as measured by cooling rate as well as by temperature and pressure effects accompanying vapor formation), without overstressing the system thermally, electrically or mechanically, thereby maximizing thermal performance while maintaining the system in a safe operating mode.

A spacing element such as a wire frame 37 may be positioned in each water channel to overcome or mitigate unbalanced pressure forces acting on the microelectronic modules. As shown in FIG. 3, wire frame 37 may be installed in each water channel while providing a minimal impediment to water flow. The channel controller also communicates with control valve 13 to keep water channel 7 full of water; this helps to flush gas bubbles to the water output.

Even a small amount of water vapor production in channel 7 may be useful to limit device temperature at a hot spot, for example; in this case the vapor production may be treated as a safety valve, preventing overheating of the devices having the highest power density (measured in W/cm$^2$) at their surface. Hermetic coating 32 is also shown, to be further described in reference to FIG. 4.

Figure 4:
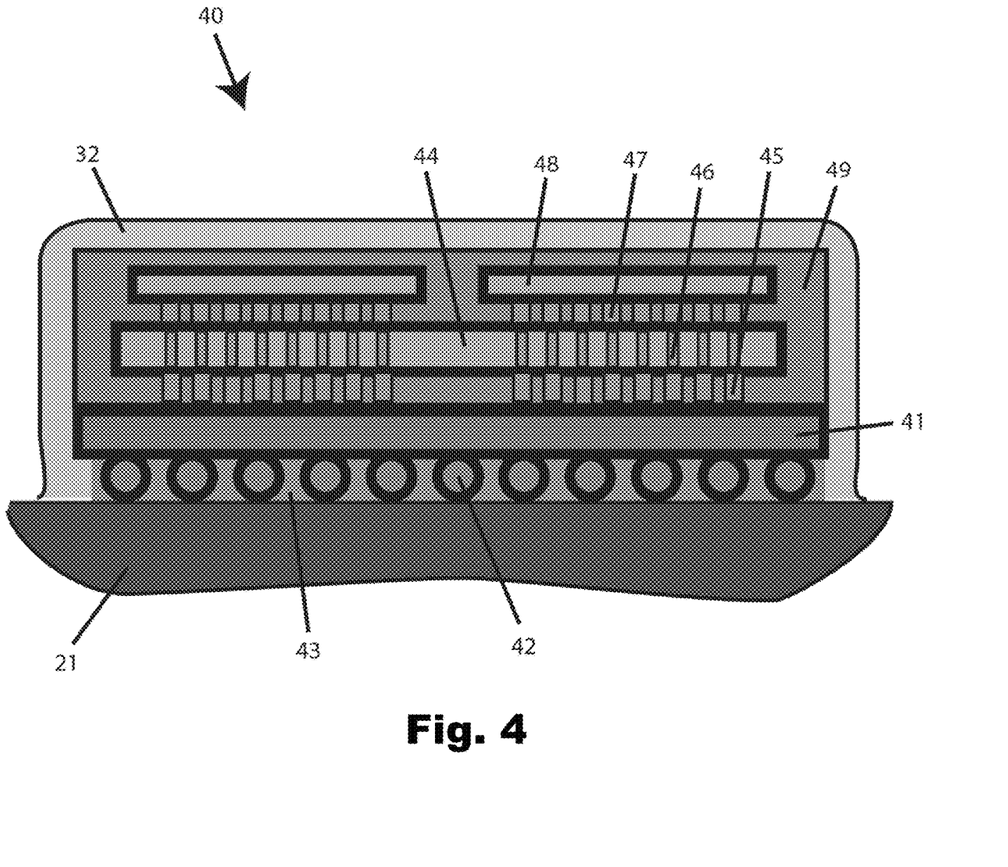
FIG. 4 illustrates an expanded cross-sectional view 40 of a low profile packaged device shown in FIG. 3, according to embodiments of the present disclosure.

FIG. 4 illustrates a low profile packaged device 40 in accordance with embodiments of the present disclosure. Package substrate 41 is shown attached to substrate 21 using solder balls 42 of a ball grid array (BGA). Underfill 43 is used to improve reliability at the BGA interface. Interposer 44 is shown attached to substrate 41 using copper pillars 45. Through silicon vias (TSVs) 46 connect copper pillars 45 to corresponding microbumps 47 used to connect a top layer chip 48 to interposer 44. Molding material 49 is shown. Hermetic coating 32 is shown as a conforming layer.

Hermetic coating 32 is a water-impermeable layer that provides a seal against water intrusion that would likely damage underlying electronic devices. Hermetic coating 32 may comprise a polymer layer such as parylene C, a metal layer such as nickel or combinations of copper and nickel, or layers produced using atomic layer deposition (ALD). Other polymer layers, other metal layers, and various combinations of ALD layers may be used in alternative embodiments. Hermetic coating 32 may include some or all of the following layers or layer combinations: a first layer of parylene C, at least one ALD layer comprising a metal oxide, a second layer of parylene C, a surface activation layer, a seed layer of copper, an electroplated copper layer, an electroplated layer of nickel or a nickel alloy, a layer of electroless nickel, a layer of electroless gold. The surface activation layer may be produced in a plasma at a temperature of 150° C. for example; it may establish covalent bonds in a surface, thereby promoting adhesion with an overlying material such as a copper seed layer. Plasma processes are judged superior to physical layer deposition (PVD, aka sputtering) processes in terms of film density, film purity, and avoidance of pinhole defects. Additionally, sputtering processes require line-of-sight depositions which involve handling of substrates through multiple vacuum cycles to produce a coating on all sides of a substrate, whereas plasma processes generally produce conformal coatings in a single vacuum cycle. Reduced handling of the product can result in reduced contamination and higher quality coatings.

Figure 5:
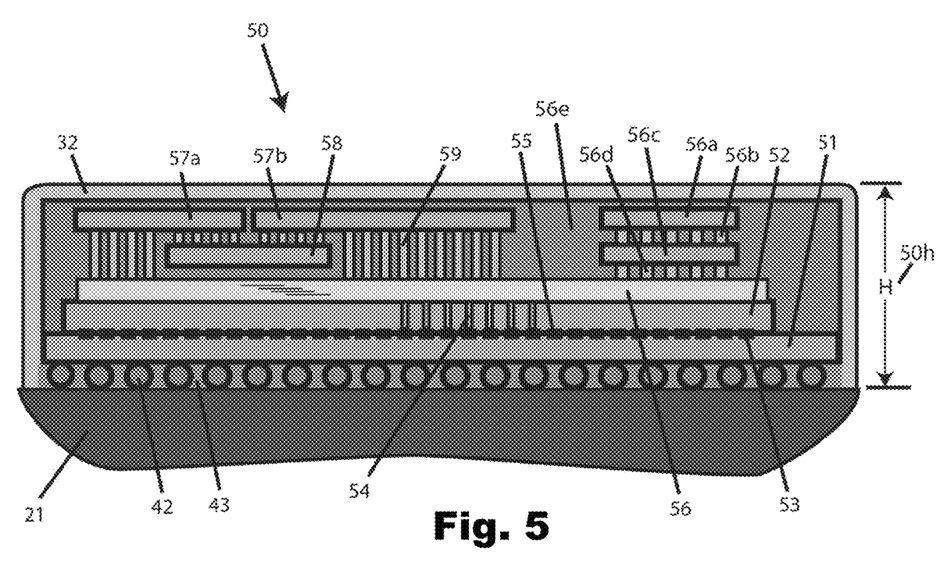
FIG. 5 illustrates an expanded cross-sectional view 50 of a stacked device shown in FIG. 3, according to embodiments of the present disclosure.

FIG. 5 illustrates a stacked device 50 in accordance with embodiments of the present disclosure. Semiconductor substrate 51 is attached to substrate 21 using solder balls 42 in a BGA configuration. Underfill 45 is shown. Interposer 52 attaches to semiconductor substrate 51 using metal-to-metal bonds, also known as hybrid bonds. Interposer 52 includes TSVs 54 to connect between hybrid bond pads and corresponding contact pads in RDLs 56. Tiered devices 56a and 56c connect using microbump terminals 56b and 56d respectively, wherein 56d terminals connect with corresponding traces of RDLs 56. Stacked chips 57a and 57b are shown with some terminals interconnected using bridge device 58. Copper pillars 59 are shown, connecting between bonding pads of chip 57b and corresponding contact pads of RDLs 56. Molding material 56e is shown. Hermetic coating 32 is applied conformally to the stacked chip assembly. The height of stacked device 50 is shown as 50h. It is anticipated that high bandwidth memory devices such as HBM3 incorporating 12 memory layers will be important components in many microelectronic modules 6 of the present disclosure. In an embodiment, a preferred maximum stack height for devices mounted on substrate 21 is set by the height of a selected high bandwidth memory device at around 0.8 mm.

Figure 6:
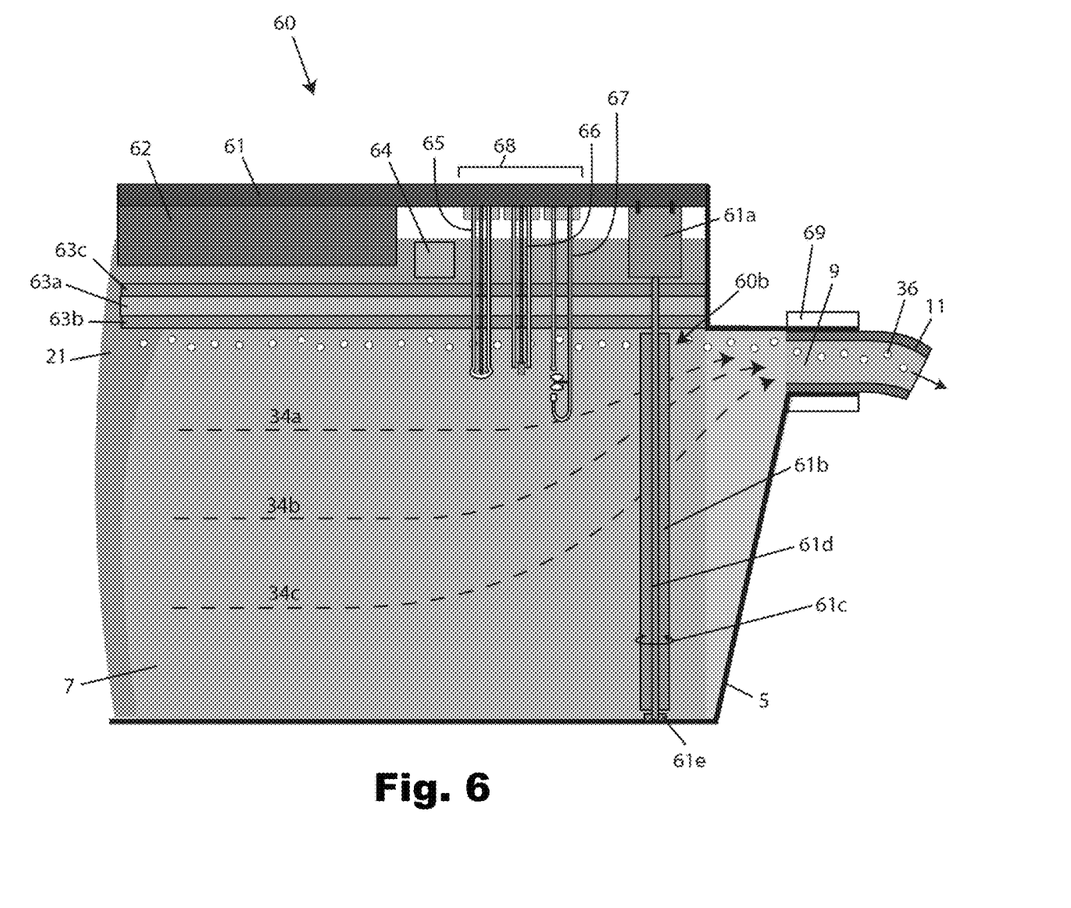
FIG. 6 illustrates in cross-section 60 a view of the region near a water output of a water-cooled server, according to embodiments of the present disclosure.

FIG. 6 illustrates a region of tank 5 near water output 9, in accordance with embodiments of the present disclosure. Substrate 21 of a microelectronic module 6 is shown connecting to a motherboard 61 via a connector 62. Connector 62 may be a socket. A water seal that protects non-immersed electronics from water intrusion comprises a gasket 63a that is compressed and held in position by backing plates 63b and 63c. Backing plates 63b and 63c may be ribbed and may comprise strong materials such as stainless steel to withstand pressure forces when vapor formation is occurring in the water channel 7.

A module controller 64 is shown in a location where wireless communications with devices such as variable pump 15 and control valve 13 is possible. A suite of sensors 68 is shown immersed in water channel 7, including temperature probe 65, pressure probe 66, and flow rate probe 67, to be further described. Flow lines 34a, 34b, 34c indicate the forward flow of cooling water towards water output 9. Water output 9 is positioned near the top of water channel 7 to effectively capture vapor bubbles 36 in the water flow. In addition, to prevent trapping of vapor bubbles near the top of water channel 7, the channel is maintained full of water via a controller sending commands to control valve 13; the controller may be a channel controller mounted on motherboard 61 for example. Water conduit 11 is coupled to tank 5 using coupler 69.

Programmable flow control assembly 60b is shown comprising a stepper motor 61a, a paddle 61b coupled to the stepper motor that is rotatable 61c around shaft 61d in small increments. A distal end of shaft 61d may be captured in a ring 61e welded to the base of tank 5 as shown. Programmable flow control assembly 60b can be used to modulate water flow in the water channel, providing an additional control measure for achieving the desired optimal balance between single-phase and two-phase cooling in the channel.

Figures 7, 8:
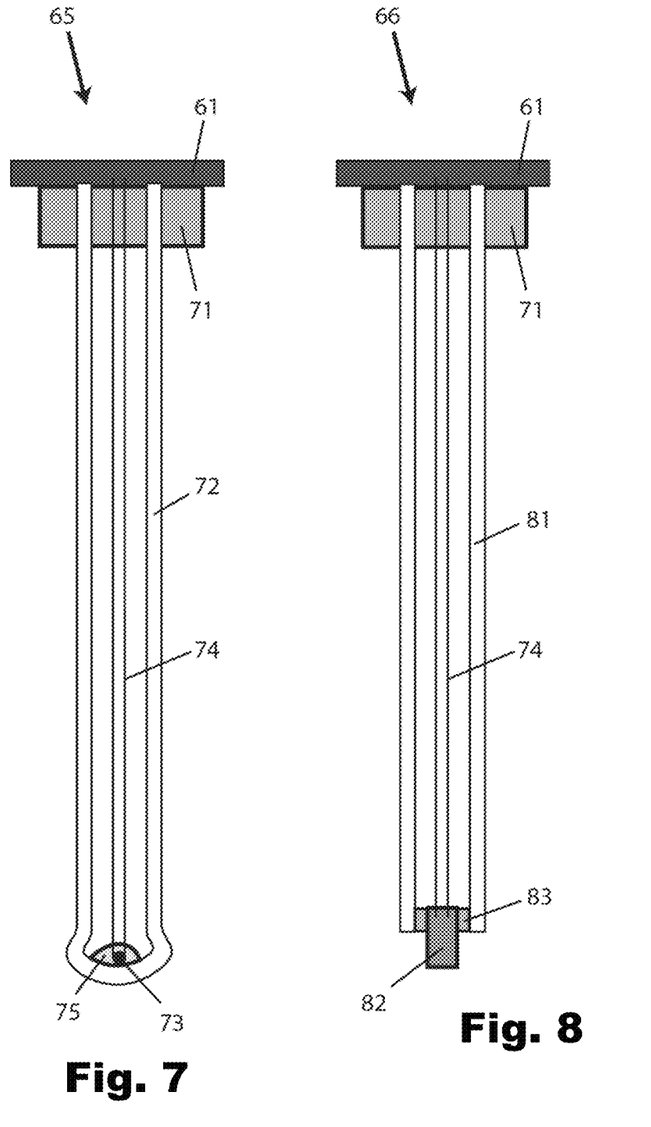
FIG. 7 illustrates in cross-section 70 a temperature probe, according to embodiments of the present disclosure.
FIG. 8 illustrates in cross-section 80 a pressure probe, according to embodiments of the present disclosure.

FIG. 7 illustrates temperature probe 65 in an embodiment of the present disclosure. A glass vial 72 is attached to motherboard 61 via an attachment ring 71. A pair of wires 74 connect a thermocouple 73 to contact pads on the motherboard. A bead of epoxy 75 bonds thermocouple 73 to glass vial 72 as shown. By performing analog-to-digital conversion on the thermocouple output a controller can determine the temperature at the point of immersion in water channel 7.

For more detailed control of the optimal conditions for balancing single-phase and two-phase cooling in a channel, a second temperature probe 65 may be immersed at the front end of the channel, near water input 8. A network of thermal test chips 22 may be included on each side of each microelectronic module 6. Each thermal test chip (TTC) may comprise a diode that can be calibrated to make a temperature measurement. If TTCs are distributed over the surface of a microelectronic module, including next to high-powered components, a thermal map can be generated which provides another input to the algorithm for achieving an optimal balance between single-phase and two-phase cooling in the channel. In an embodiment, thermal test chip TTC-1001 from Thermal Engineering Associates Inc., located in Santa Clara California, is used; it has an area of 1 mm².

FIG. 8 illustrates pressure probe 66 in an embodiment of the present disclosure. It is attached and connected to motherboard 61 using attachment ring 71. A glass cylinder 81 captures MEMs device 82 using a glass frit seal 83. As an example, MEMs device 82 may measure pressure by implementing a resonant cavity, where the resonant frequency is sensitive to external pressure applied through a flexible membrane, wherein the flexible membrane is sealed from water intrusion using a hermetic coating 32. Since formation of each bubble is accompanied by an instantaneous pressure event, a controller connected to pressure probe 66 may be configured to determine a rate of formation of water vapor bubbles. This rate provides another data point for use by the master control algorithm.

Figure 9:
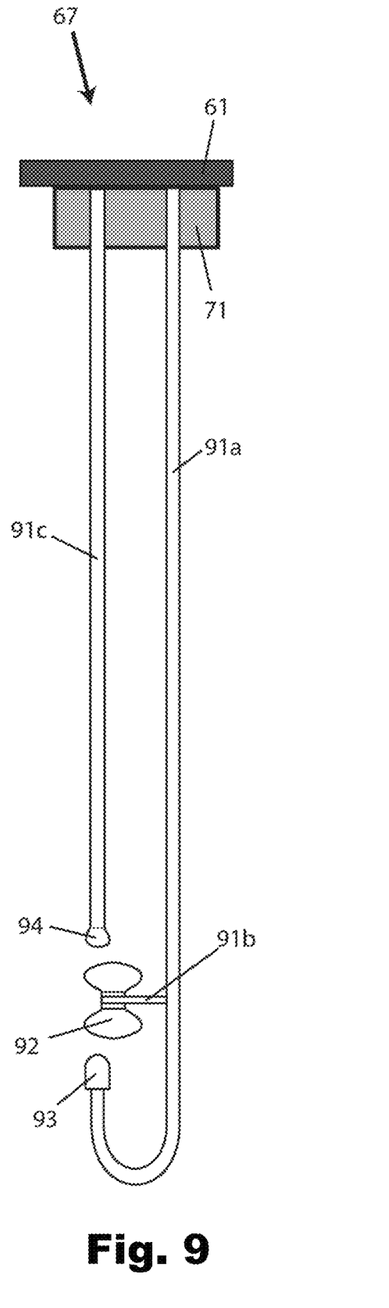
FIG. 9 illustrates in cross-section 90 a flow-rate probe, according to embodiments of the present disclosure.

FIG. 9 illustrates flow-rate probe 67 in an embodiment of the present disclosure. Support arms 91a and 91c are attached to motherboard 61 using attachment ring 71. A light emitting diode 93 is attached at the distal end of support arm 91a and directs light upward; it is powered by leads that run through support arm 91a and connect to motherboard 61. A propeller 92 rotates on a needle bearing connected via support arm 91b to support arm 91a. The speed of rotation of propeller 92 varies with water flow rate in water channel 7, and the propeller acts like a chopper to interrupt the light beam generated by light emitting diode 93. The interrupted beam is sensed by photo-sensor 94, with leads running through support member 91c to connect to motherboard 61. A controller interprets the output of photo sensor 94, and this creates another input to the algorithm for establishing an optimal balance between single-phase and two-phase cooling in the associated water channel 7. Parts of flow-rate probe 67 that are sensitive to water intrusion may be protected using hermetic coating 32.

Figure 10:
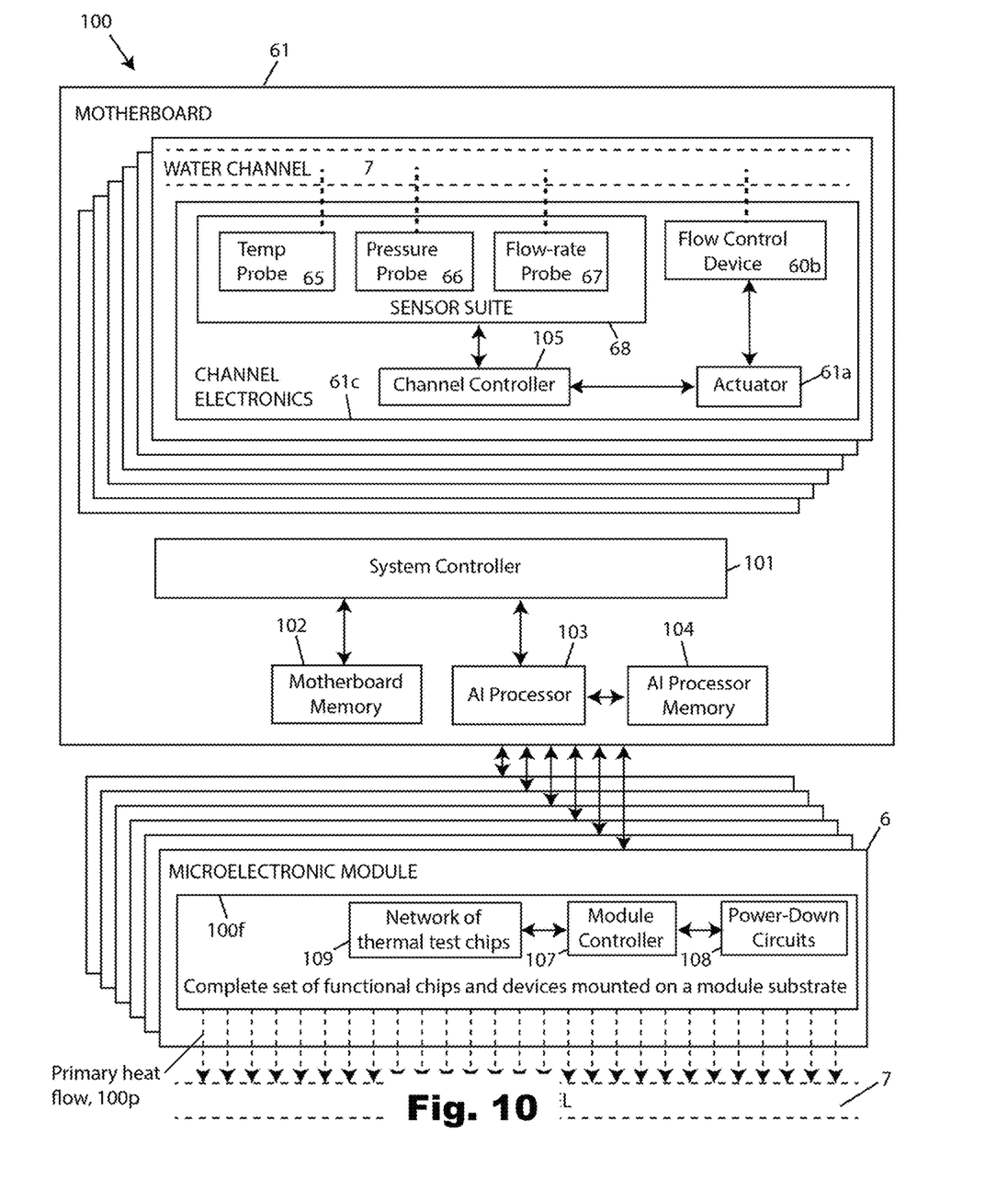
FIG. 10 illustrates a block diagram 100, showing interconnections between system components, according to embodiments of the present disclosure.

FIG. 10 is a block diagram 100 showing interconnections between system components, in accordance with embodiments of the present disclosure. In FIG. 10, water channel 7 is depicted twice with dotted lines to clarify the coupling between certain system elements.

Motherboard 61 includes a system controller, 101 which acts as a master controller for the associated water-cooled system. System controller 101 connects with motherboard memory 102 and with artificial intelligence (AI) processor 103 that is supported with AI processor memory 104. AI processor 103 cooperates with the system controller 101 and with various subordinate controllers to implement a master control algorithm for optimizing the balance between single-phase and two-phase cooling, for a system or for individual water channels within the system. The subordinate controllers may control the variable pump 15, the control valve 13, and flow control devices 60b among other system components; however, the division of control can be varied in different embodiments. Other inputs to the master control algorithm include thermal limits on electronic components, stress limits on mechanical components, and equipment performance characteristics such as for variable pump 15.

For each water channel a set of channel electronics 61c is provided, to be varied for different embodiments. Channel electronics 61c may include a channel controller 105 with included memory, actuator 61a, flow control device 60b, and sensor suite 68 comprising temperature probe 65, pressure probe 66, and flow-rate probe 67. Motherboard 61 connects via connectors 62 to each of the microelectronic modules 6 in the system. Since each two-sided module with components mounted on both sides requires a water channel on each side, there may be 7 water channels to support 6 modules as an example. Single-sided modules having components mounted on one side only may also be employed.

FIG. 10 shows that each microelectronic module 6 includes a module controller with included memory 107, power-down circuits 108, and optionally a network of thermal test chips 109. Power-down circuits 109 are deployed when the system controller determines that an unsafe operating regime is about to be entered, or when the master control algorithm demands it, or when the system needs to be powered down for maintenance for example. Block 100f signifies that the functional chips and devices mounted on a module substrate collectively dissipate heat to a water channel in a primary heat flow 100p. Although 6 water channels are shown in FIG. 10, the number of water channels in an electronic system may be less than or greater than 6. For example, the number of water channels may be any number between 1 and 100.

Figure 11:
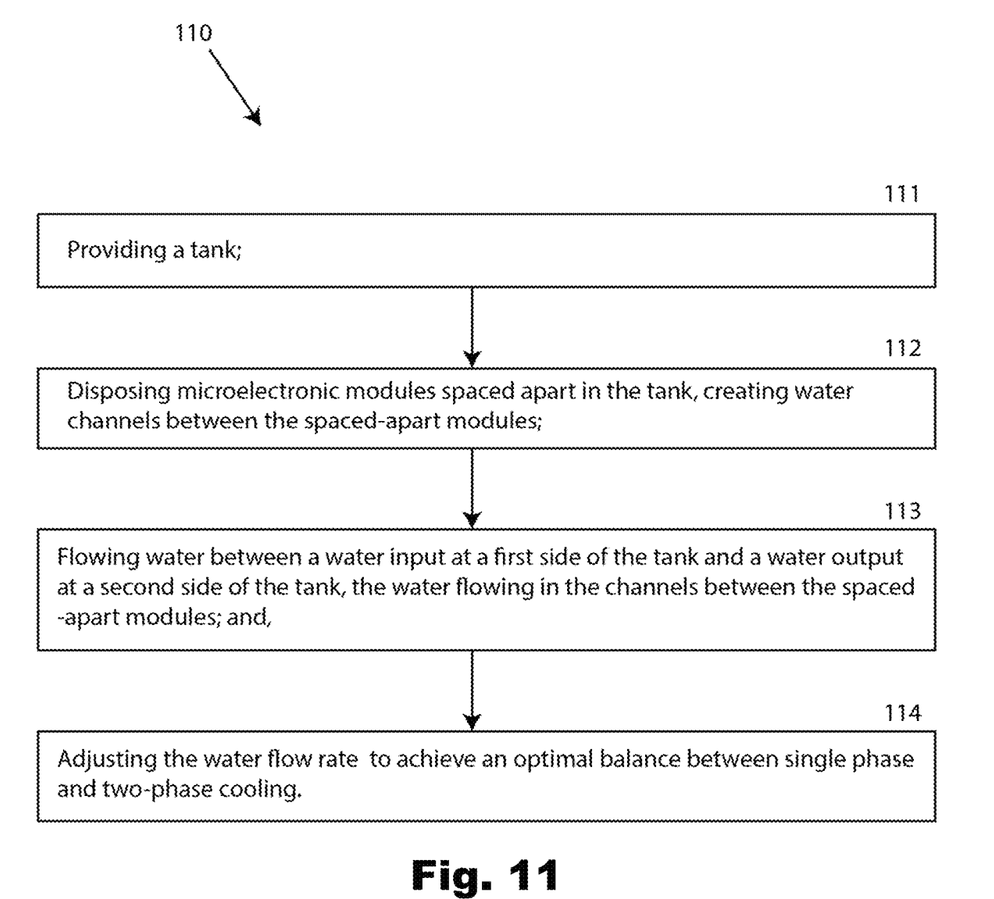
FIG. 11 illustrates a flow diagram 110 of a method for balancing single-phase and two-phase cooling, according to embodiments of the present disclosure.

FIG. 11 illustrates flow chart 110 which describes a method for building and operating a liquid-cooled electronic system, in accordance with embodiments of the present disclosure. Method 110 comprises: providing a tank, step 111; disposing microelectronic modules spaced apart in the tank, creating water channels between the spaced-apart modules, step 112; flowing water between a water input at a first side of the tank and a water output at a second side of the tank, the water flowing in the channels between the spaced-apart modules, step 113; and, adjusting the water flow rate to achieve an optimal balance between single phase and two-phase cooling, step 114.

As will be understood by those familiar with the art, the invention may be embodied in other specific forms without departing from the spirit or essential characteristics thereof. Likewise, the particular naming and division of the members, features, attributes, and other aspects are not mandatory or significant, and the mechanisms that implement the invention or its features may have different structural construct, names, and divisions. Accordingly, the disclosure of the invention is intended to be illustrative, but not limiting, of the scope of the invention.

While the invention has been described in terms of several embodiments, those of ordinary skill in the art will recognize that the invention is not limited to the embodiments described but can be practiced with modification and alteration within the spirit and scope of the appended claims. Other embodiments may comprise single-sided modules for example, with appropriate adjustments to the water channels. Different probes or sensors may be employed using different probe or sensor embodiments. The description is thus to be regarded as illustrative instead of limiting. There are numerous other variations to different aspects of the invention described above, which in the interest of conciseness have not been provided in detail. Accordingly, other embodiments are within the scope of the claims.

The invention has been described in relation to particular examples, which are intended in all respects to be illustrative rather than restrictive. Those skilled in the art will appreciate that many different combinations will be suitable for practicing the present invention. For example, the motherboard may be located outside of the tank, with wireless or fiber-optic communications to a portion of each module that is above water. Other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

What is claimed is:

1. A water-cooled electronic system comprising:
a tank;
a plurality of microelectronic modules spaced apart in the tank, with water channels created at spaces between the plurality of microelectronic modules;
a water conduit connecting between a water input to the tank and a water output from the tank;
a variable pump, connected in series with the water conduit;
wherein each of the plurality of microelectronic modules is cooled by water flowing in water channels adjacent to the plurality of microelectronic modules,
wherein a system controller controls the variable pump and maintains a maximum ratio that is safe between two-phase cooling to single-phase cooling within the constructs of the water-cooled electronic system,
wherein each module of the plurality of microelectronic modules comprises a hermetic coating that surrounds the module except for an opening at the top, and
wherein the hermetic coating comprises a plurality of layers including some of or all of the following layers or layer combinations:
a first layer of parylene C;
atomic layer deposition of at least one metal oxide layer;
a second layer of parylene C;
a surface activation layer;
a seed layer of copper;
an electroplated copper layer;
an electroplated layer of a nickel alloy;
a layer of electroless nickel; and
a layer of electroless gold.

2. The water-cooled electronic system of claim 1, wherein the pump is operable to adjust water pressure on wireless command from the system controller.

3. The water-cooled electronic system of claim 1, wherein each module of the plurality of microelectronic modules comprises devices mounted on a substrate, the devices selected from bare die, chiplets, stacked devices, surface mount devices, and low-profile packaged devices.

4. The water-cooled electronic system of claim 1, wherein each module of the plurality of microelectronic modules comprises devices selected from processors, memories, sensors, passive devices, power converters, voltage regulators, current regulators, micro-electro-mechanical systems (MEMs), thermal test chips, optical devices, and optoelectronic devices.

5. A water-cooled electronic system comprising:
a tank;
a plurality of microelectronic modules spaced apart in the tank, with water channels created at spaces between the plurality of microelectronic modules;
a water conduit connecting between a water input to the tank and a water output from the tank;
a variable pump, connected in series with the water conduit;
wherein each of the plurality of microelectronic modules is cooled by water flowing in water channels adjacent to the plurality of microelectronic modules,
wherein a system controller controls the variable pump and maintains a maximum ratio that is safe between two-phase cooling to single-phase cooling within the constructs of the water-cooled electronic system, and
wherein each module of the plurality of microelectronic modules comprises a network of thermal test chips, each thermal test chip including at least one addressable diode.

6. The water-cooled electronic system of claim 5, wherein each module of the plurality of microelectronic modules comprises a hermetic coating that surrounds the module except for an opening at the top.

7. The water-cooled electronic system of claim 1, wherein the water conduit passes through a condensing chamber to convert a mixture of liquid water and water vapor into liquid water.

8. The water-cooled electronic system of claim 7, further comprising a refill port inserted into the water conduit.

9. The water-cooled electronic system of claim 6, wherein the hermetic coating comprises a polymer layer.

10. The water-cooled electronic system of claim 6, wherein the hermetic coating comprises a layer fabricated using atomic layer deposition.

11. The water-cooled electronic system of claim 6, wherein the hermetic coating comprises a metal layer.

12. The water-cooled electronic system of claim 6, wherein the hermetic coating comprises a plurality of layers including some of or all of the following layers or layer combinations:
a first layer of parylene C;
atomic layer deposition of at least one metal oxide layer;
a second layer of parylene C;
a surface activation layer;
a seed layer of copper;
an electroplated copper layer;
an electroplated layer of a nickel alloy;
a layer of electroless nickel; and
a layer of electroless gold.

13. The water-cooled electronic system of claim 1, further comprising spacing elements positioned between the plurality of microelectronic modules.

14. A water-cooled electronic system comprising:
a tank;
a plurality of microelectronic modules spaced apart in the tank, with water channels created at spaces between the plurality of microelectronic modules;
a water conduit connecting between a water input to the tank and a water output from the tank;
a variable pump, connected in series with the water conduit;
spacing elements positioned between the plurality of microelectronic modules,
wherein each of the plurality of microelectronic modules is cooled by water flowing in water channels adjacent to the plurality of microelectronic modules,
wherein a system controller controls the variable pump and maintains a maximum ratio that is safe between two-phase cooling to single-phase cooling within the constructs of the water-cooled electronic system, and
wherein the spacing elements comprise wire frames.

15. A water-cooled server comprising:
a tank;
a plurality of planar microelectronic modules spaced apart in the tank, with water channels created at spaces between the plurality of microelectronic modules;
a motherboard coupled to each of the plurality of microelectronic modules;
a water conduit connecting between a water input to the tank and a water output from the tank;

a variable pump, connected in series with the water conduit, the pump operable to adjust water pressure on command from a server controller;

wherein each module of the plurality of microelectronic modules is cooled by water flowing in water channels adjacent to the plurality of microelectronic modules, wherein a system controller controls the variable pump to maintain a balance between single phase cooling and two-phase cooling in the water-cooled server, adaptable to changes in the server cooling demand, for each water channel, a suite of sensors coupled to the motherboard, the suite of sensors comprising at least one of a water temperature probe and a water pressure probe, for each suite of sensors, a channel controller operable to interpret data from the suite of sensors and maintain a balance between single phase cooling and two-phase cooling, adaptable to changes in cooling demand within each water channel, wherein the flow control assembly comprises an actuator coupled to a flow-control device, and wherein the actuator comprises a stepper motor and the flow control device comprises a paddle coupled to the stepper motor.

16. The water-cooled server of claim 15, further comprising electrical and optical connectors mounted on the motherboard.

17. A water-cooled server comprising:
a tank;
a plurality of planar microelectronic modules spaced apart in the tank, with water channels created at spaces between the plurality of microelectronic modules;
a motherboard coupled to each of the plurality of microelectronic modules;
a water conduit connecting between a water input to the tank and a water output from the tank;
a variable pump, connected in series with the water conduit, the pump operable to adjust water pressure on command from a server controller;
wherein each module of the plurality of microelectronic modules is cooled by water flowing in water channels adjacent to the plurality of microelectronic modules,
wherein the system controller controls the variable pump to maintain a balance between single phase cooling and two-phase cooling in the water-cooled server, adaptable to changes in the server cooling demand, and
wherein the motherboard is protected from water intrusion via a water seal disposed between a water surface and the motherboard.

18. The water-cooled server of claim 17, further comprising:
for each water channel, a suite of sensors coupled to the motherboard, the suite of sensors comprising at least one of a water temperature probe and a water pressure probe; and,
for each suite of sensors, a channel controller operable to interpret data from the suite of sensors and maintain a balance between single phase cooling and two-phase cooling, adaptable to changes in cooling demand within each water channel.

19. The water-cooled server of claim 18, wherein the suite of sensors further comprises at least one water flow-rate probe.

20. The water-cooled server of claim 18, wherein each suite of sensors is configured to measure and record water temperature, water pressure, and provide instantaneous pressure data from which a rate of formation of water vapor bubbles may be determined.

21. The water-cooled server of claim 18, further comprising a programmable flow control assembly coupled to the motherboard and inserted into each water channel for adjusting the water flow rate in the water channel.

22. The water-cooled server of claim 21, wherein the flow control assembly comprises an actuator coupled to a flow-control device.

23. The water-cooled server of claim 22, wherein the actuator comprises a stepper motor and the flow control device comprises a paddle coupled to the stepper motor.

24. The water-cooled server of claim 18, wherein each channel controller is coupled to a processor operable to execute an artificial intelligence algorithm or a machine learning algorithm for calculating a water flow rate.

25. A water-cooled server comprising:
a tank;
a plurality of planar microelectronic modules spaced apart in the tank, with water channels created at spaces between the plurality of microelectronic modules;
a motherboard coupled to each of the plurality of microelectronic modules;
a water conduit connecting between a water input to the tank and a water output from the tank;
a variable pump, connected in series with the water conduit, the pump operable to adjust water pressure on command from a server controller;
wherein each module of the plurality of microelectronic modules is cooled by water flowing in water channels adjacent to the plurality of microelectronic modules,
wherein the system controller controls the variable pump to maintain a balance between single phase cooling and two-phase cooling in the water-cooled server, adaptable to changes in the server cooling demand, and
wherein each of the plurality of microelectronic modules comprises a substrate and a network of thermal test chips disposed on the substrate.

26. A water-cooled server comprising:
a tank;
a plurality of planar microelectronic modules spaced apart in the tank, with water channels created at spaces between the plurality of microelectronic modules;
a motherboard coupled to each of the plurality of microelectronic modules;
a water conduit connecting between a water input to the tank and a water output from the tank;
a variable pump, connected in series with the water conduit, the pump operable to adjust water pressure on command from a server controller;
wherein each module of the plurality of microelectronic modules is cooled by water flowing in water channels adjacent to the plurality of microelectronic modules; and,
wherein a system controller controls the variable pump to maintain a balance between single phase cooling and two-phase cooling in the water-cooled server, adaptable to changes in the server cooling demand;
for each water channel, a suite of sensors coupled to the motherboard, the suite of sensors comprising at least one of a water temperature probe and a water pressure probe; and,
for each suite of sensors, a channel controller operable to interpret data from the suite of sensors and maintain a balance between single phase cooling and two-phase cooling, adaptable to changes in cooling demand within each water channel;

a programmable flow control assembly coupled to the motherboard and inserted into each water channel for adjusting the water flow rate in the water channel, wherein the flow control assembly comprises an actuator coupled to a flow-control device, and wherein the actuator comprises a stepper motor and the flow control device comprises a paddle coupled to the stepper motor.

27. A water-cooled electronic system comprising:

a tank;

a plurality of planar microelectronic modules spaced apart in the tank, with water channels created at spaces between the plurality of microelectronic modules;

a water conduit connecting between a water input to the tank and a water output from the tank;

a variable pump, connected in series with the water conduit;

wherein each module of the plurality of microelectronic modules is cooled by water flowing in water channels adjacent to the plurality of microelectronic modules; and, wherein a system controller controls the variable pump to maintain a balance between single phase cooling and two-phase cooling in the water-cooled server, adaptable to changes in the server cooling demand;

for each water channel, a suite of sensors coupled to the motherboard, the suite of sensors comprising at least one of a water temperature probe and a water pressure probe; and, for each suite of sensors, a channel controller operable to interpret data from the suite of sensors and maintain a balance between single phase cooling and two-phase cooling, adaptable to changes in cooling demand within each water channel;

a programmable flow control assembly coupled to the motherboard and inserted into each water channel for adjusting the water flow rate in the water channel, wherein the flow control assembly comprises an actuator coupled to a flow-control device, and wherein the actuator comprises a stepper motor and the flow control device comprises a paddle coupled to the stepper motor.

28. A water-cooled electronic system comprising:

a tank;

a plurality of planar microelectronic modules spaced apart in the tank, with water channels created at spaces between the plurality of microelectronic modules;

a water conduit connecting between a water input to the tank and a water output from the tank;

a variable pump, connected in series with the water conduit;

wherein each module of the plurality of microelectronic modules is cooled by water flowing in water channels adjacent to the plurality of microelectronic modules, wherein a the system controller controls the variable pump to maintain a balance between single phase cooling and two-phase cooling in the water-cooled server, adaptable to changes in the server cooling demand, and wherein the motherboard is protected from water intrusion via a water seal disposed between the water surface and the motherboard.

29. A water-cooled electronic system comprising:

a tank;

a plurality of planar microelectronic modules spaced apart in the tank, with water channels created at spaces between the plurality of microelectronic modules;

a water conduit connecting between a water input to the tank and a water output from the tank;

a variable pump, connected in series with the water conduit;

wherein each module of the plurality of microelectronic modules is cooled by water flowing in water channels adjacent to the plurality of microelectronic modules, wherein a system controller controls the variable pump to maintain a balance between single phase cooling and two-phase cooling in the water-cooled server, adaptable to changes in the server cooling demand, and wherein each of the plurality of microelectronic modules comprises a substrate and a network of thermal test chips disposed on the substrate.

* * * * *